(12) United States Patent
Kazama et al.

(10) Patent No.: US 11,417,133 B2
(45) Date of Patent: Aug. 16, 2022

(54) DRAWING MANAGEMENT APPARATUS AND SYSTEM

(71) Applicant: FUJIFILM BUSINESS INNOVATION CORP., Tokyo (JP)

(72) Inventors: Atsuo Kazama, Kanagawa (JP); Hideto Shimura, Kanagawa (JP)

(73) Assignee: FUJIFILM Business Innovation Corp., Tokyo (JP)

( * ) Notice: Subject to any disclaimer, the term of this patent is extended or adjusted under 35 U.S.C. 154(b) by 686 days.

(21) Appl. No.: 15/912,759

(22) Filed: Mar. 6, 2018

(65) Prior Publication Data

US 2019/0087655 A1 Mar. 21, 2019

(30) Foreign Application Priority Data

Sep. 21, 2017 (JP) .............................. JP2017-180845

(51) Int. Cl.
*G06K 9/00* (2022.01)
*G06V 30/422* (2022.01)
*G06T 7/00* (2017.01)
*G06F 16/583* (2019.01)
(Continued)

(52) U.S. Cl.
CPC ........ *G06V 30/422* (2022.01); *G06F 16/5838* (2019.01); *G06F 16/5866* (2019.01);
(Continued)

(58) Field of Classification Search
CPC ... G06K 9/00476; G06T 7/0008; G06T 7/001; G06T 11/00; G06T 11/60; G06T 2200/24;
(Continued)

(56) References Cited

U.S. PATENT DOCUMENTS 7,471,990 B2 * 12/2008 Hotta ................... G06Q 10/087
700/106
7,606,628 B2 * 10/2009 Azuma ................... G06F 30/00
703/1
(Continued)

FOREIGN PATENT DOCUMENTS

JP H06-096148 A 4/1994
JP 2002-230041 A 8/2002
(Continued)

OTHER PUBLICATIONS

Sep. 14, 2021 Office Action issued in Japanese Patent Application No. 2017-180845.

*Primary Examiner* — Tom Y Lu
(74) *Attorney, Agent, or Firm* — Oliff PLC

(57) ABSTRACT

A drawing management apparatus includes a receiver, a searcher, and a presenter. The receiver receives input of information concerning a specific subject and information concerning a purpose of a design change to be made to the specific subject. The searcher searches for a pair of drawings which have characteristics similar to characteristics of the specific subject and which are constituted by a drawing to which a design change has been made in accordance with the purpose and a drawing to which the design change has not yet been made, on the basis of the information concerning the specific subject and the information concerning the purpose of the design change. The presenter presents the searched pair of drawings to a user.

17 Claims, 12 Drawing Sheets

(51) Int. Cl.
*G06F 16/58* (2019.01)
*G06T 11/60* (2006.01)
*G06T 11/00* (2006.01)
*G06F 30/00* (2020.01)

(52) U.S. Cl.
CPC .............. *G06F 30/00* (2020.01); *G06T 7/001* (2013.01); *G06T 7/0008* (2013.01); *G06T 11/00* (2013.01); *G06T 11/60* (2013.01); *G06T 2200/24* (2013.01)

(58) Field of Classification Search
CPC ............. G06F 16/5838; G06F 16/5866; G06F 17/30256; G06F 17/50; G06F 30/00; H01L 51/0021; H01L 51/5012; H01L 51/5016; H01L 51/5056; H01L 51/5072; H01L 51/5221; H01L 51/56
See application file for complete search history.

(56) References Cited

U.S. PATENT DOCUMENTS

| | | | |
|---|---|---|---|
| 10,592,852 B1* | 3/2020 | Karipides | G06Q 10/087 |
| 10,832,197 B1* | 11/2020 | Effler | G06Q 10/0875 |
| 2008/0297847 A1* | 12/2008 | Yamazaki | G06F 30/00 |
| | | | 358/1.15 |
| 2014/0137066 A1* | 5/2014 | Huang | G06F 30/39 |
| | | | 716/122 |
| 2016/0246899 A1* | 8/2016 | Hirschtick | G06F 30/17 |
| 2018/0272750 A1* | 9/2018 | Yamasaki | G06T 1/0007 |

FOREIGN PATENT DOCUMENTS

| | | |
|---|---|---|
| JP | 2004-192576 A | 7/2004 |
| JP | 2016-21101 A | 2/2016 |
| WO | 2015/033393 A1 | 3/2015 |

* cited by examiner

FIG. 2

| DRAWING NO. | VERSION NO. | DRAWING DATA | DESIGN CHANGE MATERIAL | DRAWING CHARACTERISTICS | PURPOSE OF CHANGE | POINT TO NOTE | COMPARATIVE DRAWING FOR PREVIOUS VERSION |
|---|---|---|---|---|---|---|---|
| 1 | 1 | YES | NO | ROBOT, ROTATING SHAFT | N/A | N/A | N/A |
| 1 | 2 | YES | YES | ROBOT, ROTATING SHAFT | COST REDUCTION | SAME PART, ROTATING SPEED | YES |
| 1 | 3 | YES | YES | ROBOT, ROTATING SHAFT | HIGHER PRECISION | SURFACE, POLISH | YES |
| 2 | 1 | YES | NO | VEHICLE, WHEEL | N/A | N/A | N/A |
| 2 | 2 | YES | YES | VEHICLE, WHEEL | HIGHER FUEL EFFICIENCY | BEARING | YES |
| 7 | 1 | YES | NO | L-SHAPED BRACKET, SHELF | N/A | N/A | N/A |
| 7 | 2 | YES | YES | L-SHAPED BRACKET, SHELF | HIGHER DURABILITY | THICKNESS | YES |
| ... | ... | ... | ... | ... | ... | ... | ... |

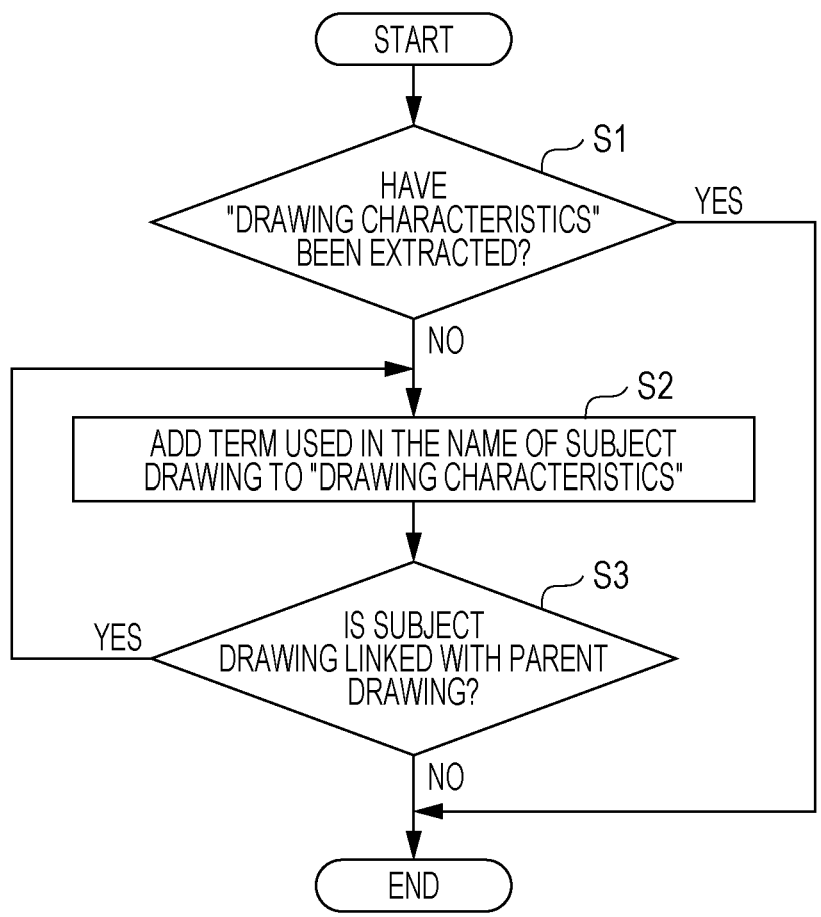

FIG. 4

| DRAWING NO. | ORIGINAL DRAWING | LARGE ASSY | INTERMEDIATE ASSY | SMALL ASSY | SUB-ASSY | PART |
|---|---|---|---|---|---|---|
| ... | ... | ... | ... | ... | ... | ... |
| 11 | ROBOT | ARM | HAND | THUMB | ... | ... |
| 12 | ROBOT | ARM | HAND | INDEX FINGER | JOINT | MOTOR |
| 13 | ROBOT | ARM | HAND | INDEX FINGER | JOINT | ROTATING SHAFT |
| 14 | ROBOT | ARM | HAND | INDEX FINGER | JOINT | SENSOR |
| 15 | ROBOT | ARM | HAND | INDEX FINGER | JOINT | HARNESS |
| 16 | ROBOT | ARM | HAND | INDEX FINGER | FINGERTIP | ... |
| 17 | ROBOT | ARM | HAND | INDEX FINGER | SECTION | ... |
| 18 | ROBOT | ARM | HAND | MIDDLE FINGER | ... | ... |
| 19 | ROBOT | ARM | HAND | RING FINGER | ... | ... |
| 20 | ROBOT | ARM | HAND | LITTLE FINGER | ... | ... |
| 21 | ROBOT | ARM | HAND | PALM | ... | ... |
| 22 | ROBOT | ARM | FIRST ARM | ... | ... | ... |
| 23 | ROBOT | ARM | ELBOW | ... | ... | ... |
| 24 | ROBOT | ARM | SECOND ARM | ... | ... | ... |
| 25 | ROBOT | ARM | SHOULDER | ... | ... | ... |
| 26 | ROBOT | LEG | FOOT | ... | ... | ... |
| 27 | ROBOT | LEG | ANKLE | ... | ... | ... |
| 28 | ROBOT | LEG | SHIN | ... | ... | ... |
| 29 | ROBOT | LEG | KNEE | ... | ... | ... |
| 30 | ROBOT | LEG | THIGH | ... | ... | ... |
| 31 | ROBOT | HEAD | ... | ... | ... | ... |
| 32 | ROBOT | ... | ... | ... | ... | ... |
| 33 | VEHICLE | WHEEL | AXLE | ROTATING SHAFT | ... | ... |
| 34 | VEHICLE | WHEEL | HUB | ... | ... | ... |
| 35 | VEHICLE | WHEEL | RIM | ... | ... | ... |
| 36 | VEHICLE | WHEEL | TIRE | ... | ... | ... |
| 37 | VEHICLE | ENGINE | ... | ... | ... | ... |
| 38 | VEHICLE | BODY | ... | ... | ... | ... |
| ... | ... | ... | ... | ... | ... | ... |
| ... | ... | ... | ... | ... | ... | ... |

FIG. 7

DRAWING NO. 50    VERSION NO. 2    DRAWING NAME *****

⋮

DESIGN CHANGE PURPOSE
Robot test shows that 150-rpm right angle motor operates at 13.5 degrees, but operates too fast for ball handling to be controlled. Then, a spec change is made to use a motor having the same hub as that of a 44-rpm motor shaft.

DESIGN CHANGE DESCRIPTION
Spline of 44-rpm motor is changed so that an 8-mm diameter thread is formed in the socket for the use of M8 screw and a 10-mm diameter hole is bored in the hub.

⋮

DRAWING NO. 80    VERSION NO. 4    DRAWING NAME *****

⋮

DESIGN CHANGE PURPOSE
When providing a "drawer" in a shelf using L-shaped brackets, the effective depth in space is extended to increase the capacity by eliminating cross bracing.

DESIGN CHANGE DESCRIPTION
By processing a material in a corrugated shape, durability is maintained at 60 kgf to eliminate the need of cross bracing.

⋮

| DRAWING NO. | VERSION NO. | EVALUATION VARIABLE | VALUE |
|---|---|---|---|
| 1 | 1 | COST | 84 |
| 1 | 1 | PRECISION | 0.019 |
| 1 | 2 | COST | 79 |
| 1 | 2 | PRECISION | 0.025 |
| 1 | 3 | COST | 80 |
| 1 | 3 | PRECISION | 0.02 |
| ⋮ | ⋮ | ⋮ | ⋮ |

| EVALUATION VARIABLE | UNIT | EVALUATION STANDARD |
|---|---|---|
| COST | YEN | SMALLER (LESS) |
| FLEXURAL RIGIDITY | N*MM^2 | GREATER (MORE) |
| PRECISION | mm | ABSOLUTE VALUE IS SMALLER (LESS) |
| ⋮ | ⋮ | ⋮ |

DRAWING MANAGEMENT APPARATUS AND SYSTEM

CROSS-REFERENCE TO RELATED APPLICATIONS

This application is based on and claims priority under 35 USC 119 from Japanese Patent Application No. 2017-180845 filed Sep. 21, 2017.

BACKGROUND

(i) Technical Field

The present invention relates to a drawing management apparatus and system.

(ii) Related Art

Hitherto, technologies for supporting product design work conducted by designers, for example, have been proposed.

SUMMARY

According to an aspect of the invention, there is provided a drawing management apparatus including a receiver, a searcher, and a presenter. The receiver receives input of information concerning a specific subject and information concerning a purpose of a design change to be made to the specific subject. The searcher searches for a pair of drawings which have characteristics similar to characteristics of the specific subject and which are constituted by a drawing to which a design change has been made in accordance with the purpose and a drawing to which the design change has not yet been made, on the basis of the information concerning the specific subject and the information concerning the purpose of the design change. The presenter presents the searched pair of drawings to a user.

BRIEF DESCRIPTION OF THE DRAWINGS

An exemplary embodiment of the present invention will be described in detail based on the following figures, wherein:

FIG. 2 illustrates a specific example of drawing information;

FIG. 3 is a flowchart illustrating a specific example of processing for extracting characteristics of a drawing;

FIG. 4 illustrates a specific example of a tree structure representing a parent-child relationship of drawings;

FIG. 7 illustrates specific examples of design change materials;

DETAILED DESCRIPTION

Figure 1:
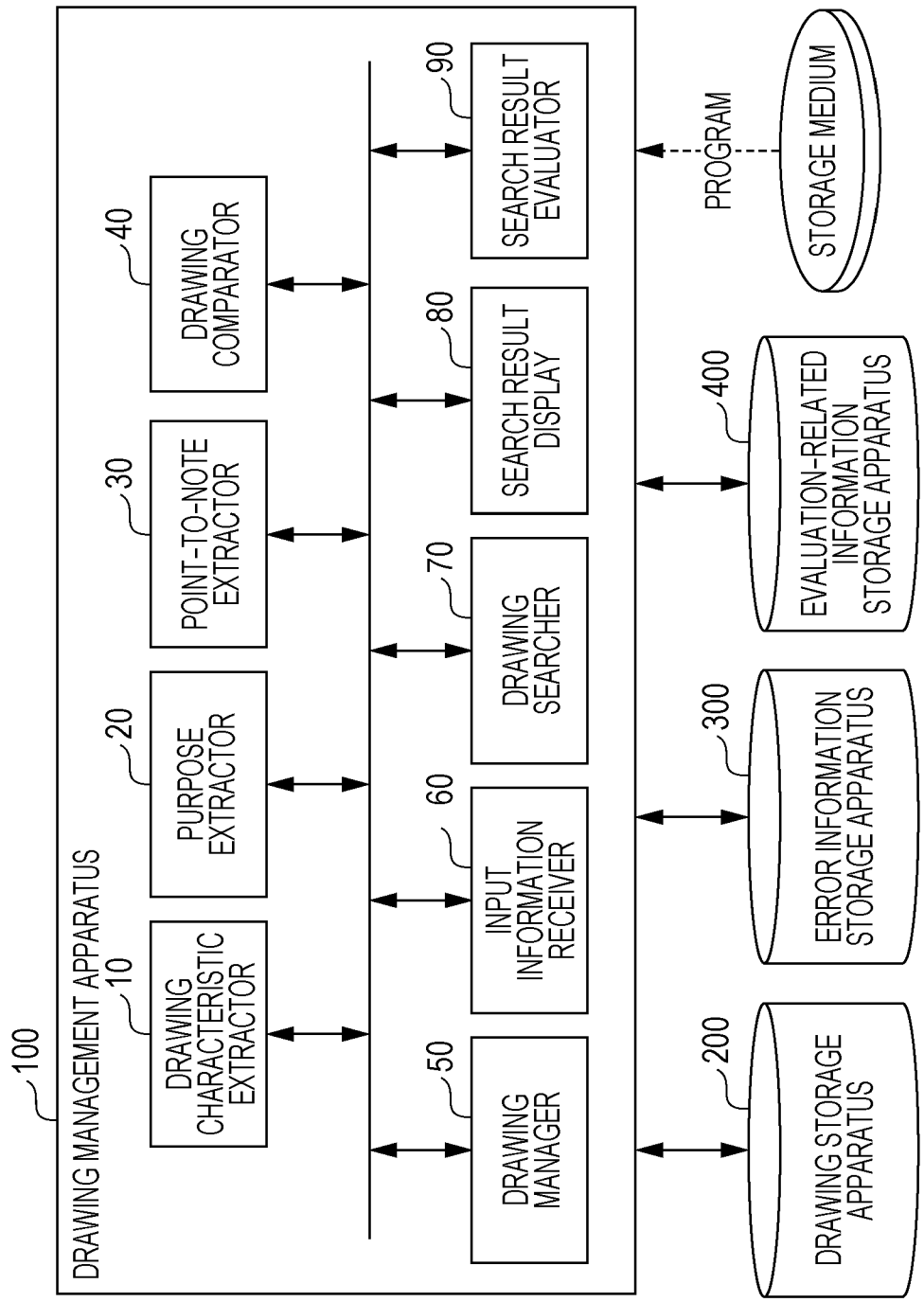
FIG. 1 illustrates a specific example of a drawing management system according to an exemplary embodiment.

FIG. 1 illustrates a specific example of a drawing management system according to an exemplary embodiment. The drawing management system shown in FIG. 1 includes a drawing management apparatus 100, a drawing storage apparatus 200, an error information storage apparatus 300, and an evaluation-related information storage apparatus 400.

The overall configuration of the drawing management system will first be described below.

The drawing management apparatus 100 manages plural drawings. The drawing management apparatus 100 includes a drawing characteristic extractor 10, a purpose extractor 20, a point-to-note extractor 30, a drawing comparator 40, a drawing manager 50, an input information receiver 60, a drawing searcher 70, a search result display 80, and a search result evaluator 90.

The drawing characteristic extractor 10 extracts, concerning each drawing, characteristic terms of a drawing as the characteristics of this drawing. The purpose extractor 20 extracts, concerning each drawing, the purpose of a design change made to a drawing from design change information concerning this drawing. The point-to-note extractor 30 extracts, concerning each drawing, a point to note on designing of a drawing from the design change information concerning this drawing. The drawing comparator 40 generates, concerning each drawing, comparison information by comparing the image of a drawing to which a design change has been made with that of a drawing to which the design change has not yet been made. The drawing manager 50 manages, concerning each drawing, a drawing in association with the characteristics of this drawing, the purpose of a design change made to this drawing, a point to note on designing of this drawing, and comparison information concerning this drawing.

The input information receiver 60 receives input of information concerning a specific subject and information concerning the purpose of a design change to be made to this subject. On the basis of the information received by the input information receiver 60, the drawing searcher 70 searches for a pair of drawings which have characteristics similar to those of the specific subject and which are constituted by a drawing to which a design change has been made in accordance with the purpose obtained from the input information and a drawing to which the design change has not yet been made. The search result display 80 presents search results obtained by the drawing searcher 70 to a user. The search result evaluator 90 evaluates the search results obtained by the drawing searcher 70.

The drawing management apparatus 100 may be implemented by using a computer, for example. The computer includes various hardware resources. Examples of the hardware resources are a processor device, such as a central processing unit (CPU), a storage device, such as a memory and a hard disk, a communication device using a communication line, such as the Internet, a device for reading data from a storage medium, such as an optical disc or a semiconductor memory, and for writing read data into the storage medium, a display device, such as a display, and an operation device for receiving operation from a user.

A program (software) corresponding to at least some functions of the elements forming the drawing management apparatus 100 shown in FIG. 1 is read into the computer. Then, as a result of this program (software) and the hardware resources of the computer operating together, the corresponding functions are implemented by the computer. This program may be provided to the computer (drawing management apparatus 100) via a communication line, such as the Internet, or may be stored in a storage medium, such as an optical disc, and be provided to the computer (drawing management apparatus 100).

The drawing storage apparatus 200 includes a storage device, such as a hard disk, and stores drawing data (image data) concerning plural drawings and drawing information concerning these plural drawings. The error information storage apparatus 300 and the evaluation-related information storage apparatus 400 also each store a storage device, such as a hard disk. The error information storage apparatus 300 stores error information concerning plural drawings. The evaluation-related information storage apparatus 400 stores evaluation-related information used for evaluating search results obtained by the drawing searcher 70 of the drawing management apparatus 100.

Details of the functions implemented by the drawing management system shown in FIG. 1 will now be described below.

FIG. 2 illustrates a specific example of drawing information. Drawing information is associated with each of plural drawings managed by the drawing management system shown in FIG. 1. The drawing information is stored in the drawing storage apparatus 200 shown in FIG. 1.

In FIG. 2, a specific example of drawing information concerning plural drawings is shown. The plural drawings are distinguished from each other by a drawing number ("drawing No." in FIG. 2) and a version number ("version No." in FIG. 2), for example. That is, one drawing (each drawing) is identified by the drawing number and the version number. As in the specific example shown in FIG. 2, certain items of drawing information are associated with each drawing identified by the drawing number and the version number.

In the specific example in FIG. 2, "drawing data", "design change material", "drawing characteristics", "purpose of change", "point to note", and "comparative drawing for previous version" are associated with each drawing as drawing information.

"Drawing data" indicates whether image data of a drawing is available. "Design change material" indicates whether a design change material for a drawing is available. The specific example in FIG. 2 shows that, concerning the drawing identified by the drawing number "1" and the version number "1", drawing data is available, but a design change material is not available. The drawing data may be stored in a storage apparatus different from the drawing storage apparatus 200, though it is desirably stored together with the drawing information in the drawing storage apparatus 200.

"Drawing characteristics" indicates characteristic terms of a drawing and are extracted by the drawing characteristic extractor 10 (see FIG. 3). "Purpose of change" indicates the purpose of a design change made to a drawing and is extracted by the purpose extractor 20 (see FIG. 5). "Point to note" indicates a point to note on designing of a drawing and is extracted by the point-to-note extractor 30 (see FIG. 6). "Comparative drawing for previous version" indicates a specific example of comparison information obtained by comparing the image of a drawing to which a design change has been made with that of a drawing to which the design change has not yet been made, and is generated by the drawing comparator 40 (see FIG. 8).

The drawings of the version number "1" are drawings generated by the initial designing, and no design change has been made to these drawings. In the specific example in FIG. 2, "design change material", "purpose of change", "point to note", and "comparative drawing for previous version" are not associated with the drawings of the version number "1".

FIG. 3 is a flowchart illustrating a specific example of processing for extracting characteristics of a drawing. For some of the plural drawings (desirably, all the drawings) managed by the drawing management system, the drawing characteristic extractor 10 extracts characteristics of each of the plural drawings by executing the processing shown in FIG. 3. For example, the drawing characteristic extractor 10 executes the processing shown in FIG. 3 for plural drawings that are already stored in the drawing storage apparatus 200, and also executes the processing for plural drawings that will be stored in the drawing storage apparatus 200.

First, in step S1, concerning each drawing, the drawing characteristic extractor 10 checks whether characteristics of a subject drawing are already extracted. If the characteristics of the subject drawing are already extracted, the drawing characteristic extractor 10 terminates the processing.

If characteristics of the subject drawing are not yet extracted, in step S2, the drawing characteristic extractor 10 extracts characteristic terms of the subject drawing as the characteristics of this drawing. For example, the drawing characteristic extractor 10 extracts a term used in the name of the subject drawing as a characteristic of the drawing.

If the drawings are managed as a tree structure, the drawing characteristic extractor 10 traces the tree structure and extracts characteristic terms from the subject drawing and its parent drawing as the characteristics of this drawing.

More specifically, in step S3, the drawing characteristic extractor 10 checks whether the subject drawing is linked with a parent drawing. If it is found in step S3 that the subject drawing is not linked with a parent drawing, the drawing characteristic extractor 10 completes the processing. If this subject drawing is linked with a parent drawing, the drawing characteristic extractor 10 extracts characteristic terms used in the name of the parent drawing as the characteristics of the subject drawing. The drawing characteristic extractor 10 then checks in step S3 whether this parent drawing is linked with another parent drawing positioned on a higher level of the tree structure.

In this manner, if the drawings are managed as a tree structure, steps S2 and S3 are repeated as long as the drawing characteristic extractor 10 finds a parent drawing on the upstream side in the tree structure and sequentially extracts terms as the characteristics of the subject drawing. When the drawing characteristic extractor 10 finds no parent drawing in the tree structure, it completes the processing in FIG. 3.

FIG. 4 illustrates a specific example of the tree structure representing the parent-child relationship of drawings. If the characteristics of the drawing identified by the drawing number "13" in this specific example are extracted according to the flowchart in FIG. 3, terms are sequentially extracted by tracing the parent drawings, such as "rotating shaft"→"rotating shaft, joint"→"rotating shaft, joint, index finger"→"rotating shaft, joint, index finger, hand"→and so on. Plural terms "rotating shaft, joint, index finger, hand, arm, robot" extracted as a result of tracing up to the drawing of "robot" (original drawing) at the highest level of the tree structure are set as the characteristics of the drawing identified by the drawing number "13".

If the same drawing (drawing of the same part) is used for plural structures, the characteristics of this drawing are desirably extracted so as to understand that the same drawing is used for plural structures. In the specific example in FIG. 4, if "rotating shaft" corresponding to the drawing of the drawing number "13" is used for all the fingers of the same hand, plural terms such as "rotating shaft, joint (×5), hand (×5), arm (×5), robot (×5), index finger, middle finger, ring finger, little finger, thumb" are extracted as the characteristics of the drawing of the drawing number "13".

If the same term is repeatedly extracted as a result of extracting plural terms by tracing parent drawings, the extracted terms are desirably rearranged in descending order of the appearance frequency.

Figure 5:
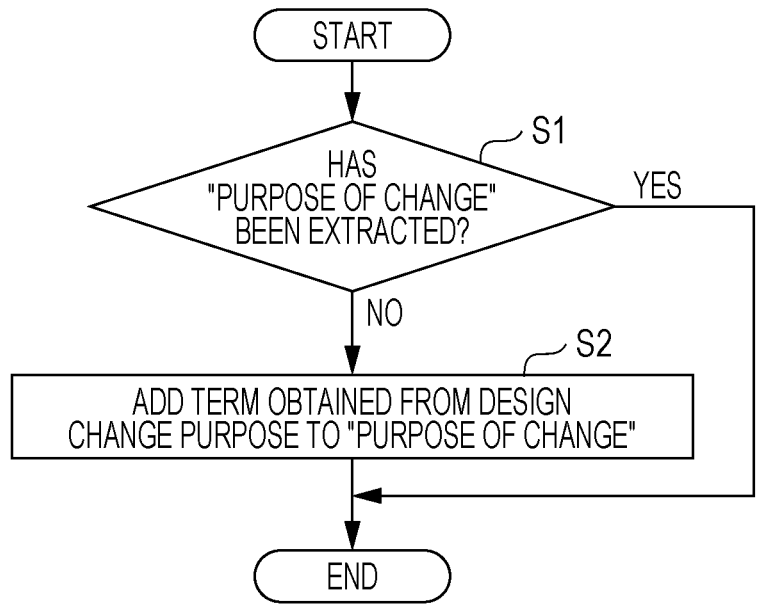
FIG. 5 is a flowchart illustrating a specific example of processing for extracting the purpose of a design change.

FIG. 5 is a flowchart illustrating a specific example of processing for extracting the purpose of a design change. For some of the plural drawings (desirably, all the drawings of version 2 and later) managed by the drawing management system, the purpose extractor 20 extracts the purpose of a design change made to each drawing by executing the processing shown in FIG. 5. For example, the purpose extractor 20 executes the processing shown in FIG. 5 for plural drawings of version number 2 and later that are already stored in the drawing storage apparatus 200, and also executes the processing for plural drawings of version 2 and later that will be stored in the drawing storage apparatus 200.

First, in step S1, concerning each drawing, the purpose extractor 20 checks whether the purpose of a design change made to a subject drawing is already extracted. If the purpose of the design change is already extracted, the purpose extractor 20 terminates the processing.

If the purpose of a design change is not yet extracted, in step S2, the purpose extractor 20 extracts the purpose of a design change made to the subject drawing from the design change information concerning the subject drawing. For example, the purpose extractor 20 extracts a terms (word) included in a field of a design change purpose of a design change material, which will be discussed later, concerning the subject drawing as the purpose of a design change. Then, the purpose extractor 20 completes the processing of FIG. 5.

Figure 6:
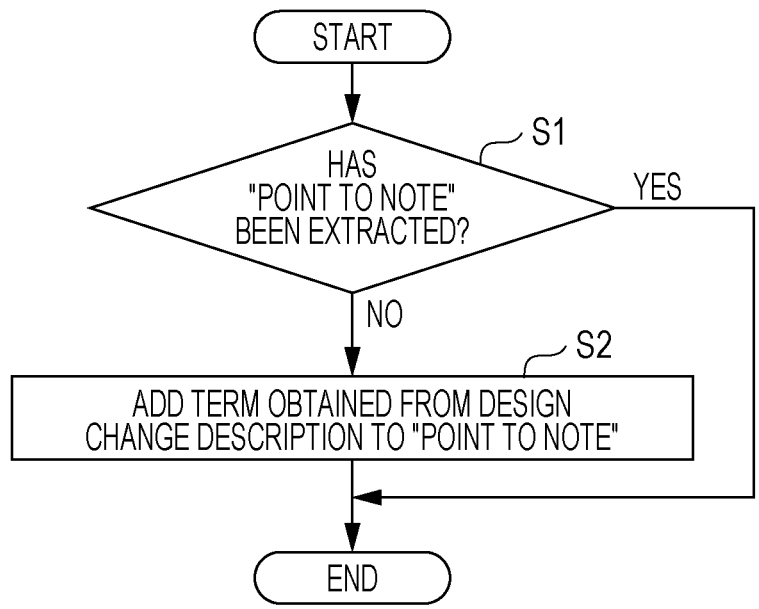
FIG. 6 is a flowchart illustrating a specific example of processing for extracting a point to note.

FIG. 6 is a flowchart illustrating a specific example of processing for extracting a point to note. For some of the plural drawings (desirably, all the drawings of version 2 and later) managed by the drawing management system, the point-to-note extractor 30 extracts, concerning each drawing, a point to note on designing of a drawing by executing the processing shown in FIG. 6. For example, the point-to-note extractor 30 executes the processing in FIG. 6 for plural drawings of version number 2 and later that are already stored in the drawing storage apparatus 200, and also executes the processing for plural drawings of version 2 and later that will be stored in the drawing storage apparatus 200.

First, in step S1, concerning each drawing, the point-to-note extractor 30 checks whether a point to note on designing of a subject drawing is already extracted. If a point to note is already extracted, the point-to-note extractor 30 terminates the processing.

If a point to note is not yet extracted, in step S2, the point-to-note extractor 30 extracts a point to note on designing of the subject drawing from the design change information concerning the subject drawing. For example, the point-to-note extractor 30 extracts a term (word) included in a field of a design change description of a design change material, which will be discussed later, concerning the subject drawing as a point to note. Then, the point-to-note extractor 30 completes the processing of FIG. 6.

FIG. 7 illustrates specific examples of design change materials. For example, every time a version change is made to a drawing due to a certain design change during product design work, for example, a design change material is formed for a drawing of a new version (version 2 or later) and is linked with this drawing. As in the examples in FIG. 7, the design change material includes a field of a design change purpose and a field of a design change description. In the field of a design change purpose, the purpose of a design change is described. In the field of a design change description, a description of a design change is provided.

The purpose extractor 20 extracts terms (words) included in the field of a design change purpose as the purpose of a design change (see FIG. 5). The point-to-note extractor 30 extracts terms (words) included in the field of a design change description as a point to note of a design change (see FIG. 6). By using a known document analyzing technique, for example, the purpose extractor 20 and the point-to-note extractor 30 extract character information in the field of a design change purpose and the field of a design change description as a meaningful group or unit.

For example, in a first specific example of the design change material indicated in the upper section of FIG. 7, the purpose extractor 20 extracts keywords such as "robot test, right angle motor, 150 rpm, 44 rpm, ball handling, to be controlled, too fast, hub, motor shaft, the same, spec change" from the field of a design change purpose as the terms describing the purpose of a design change. The point-to-note extractor 30 extracts keywords such as "44 rpm, motor, spline, M8 screw, socket, 8-mm diameter, thread, hub, 10-mm diameter" from the field of a design change description as the terms describing the points to note.

For example, in a second specific example of the design change material indicated in the lower section of FIG. 7, the purpose extractor 20 extracts keywords such as "providing a drawer in a shelf using L-shaped brackets, the effective depth in space is extended to increase the capacity, eliminating cross bracing" from the field of a design change purpose as the terms describing the purpose of a design change. The point-to-note extractor 30 extracts keywords such as "processing a material in a corrugated shape, durability is maintained, eliminate the need of cross bracing" from the field of a design change description as the terms describing the points to note.

Figure 8:
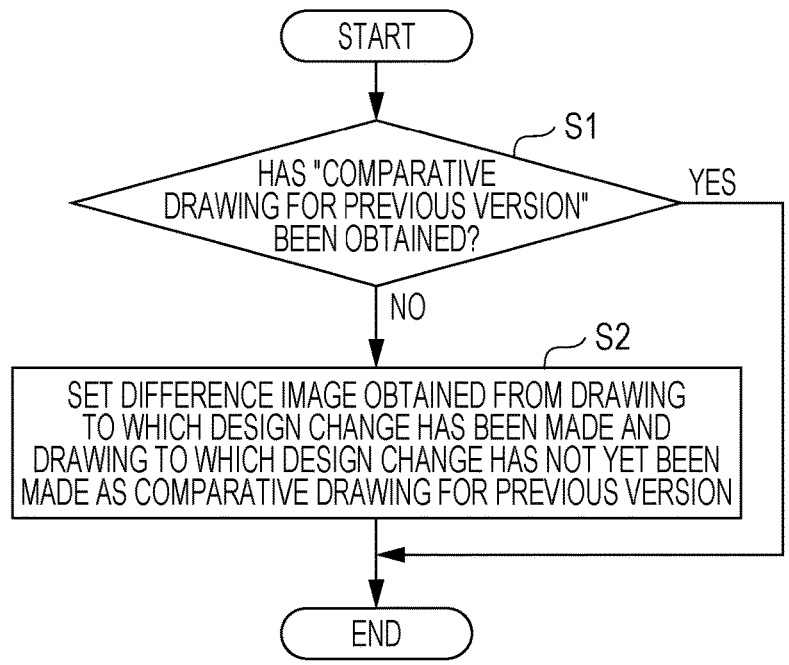
FIG. 8 is a flowchart illustrating a specific example of processing for obtaining a comparative drawing for the previous version.

FIG. 8 is a flowchart illustrating a specific example of processing for obtaining a comparative drawing for the previous version. For some of the plural drawings (desirably, all the drawings of version 2 and later) managed by the drawing management system, the drawing comparator 40 obtains a comparative drawing for the previous version for each drawing by executing the processing shown in FIG. 8. For example, the drawing comparator 40 executes the processing shown in FIG. 8 for plural drawings of version number 2 and later that are already stored in the drawing storage apparatus 200, and also executes the processing for plural drawings of version 2 and later that will be stored in the drawing storage apparatus 200.

First, in step S1, concerning each drawing, the drawing comparator 40 checks whether a comparative drawing for the previous version is already obtained. If a comparative drawing is already obtained, the drawing comparator 40 terminates the processing.

If a comparative drawing is not yet obtained, in step S2, concerning each drawing, the drawing comparator 40 compares the image of a drawing to which a design change has been made with that of a drawing to which the design change has not yet been made so as to generate a comparative drawing for the previous version which serves as comparison information. For example, the drawing comparator 40 obtains a difference between the image of a drawing to which a design change has been made and that of a drawing to which the design change has not yet been made and sets this difference as a comparative drawing for the previous version. Then, the drawing comparator 40 completes the processing of FIG. 8.

Figure 9:
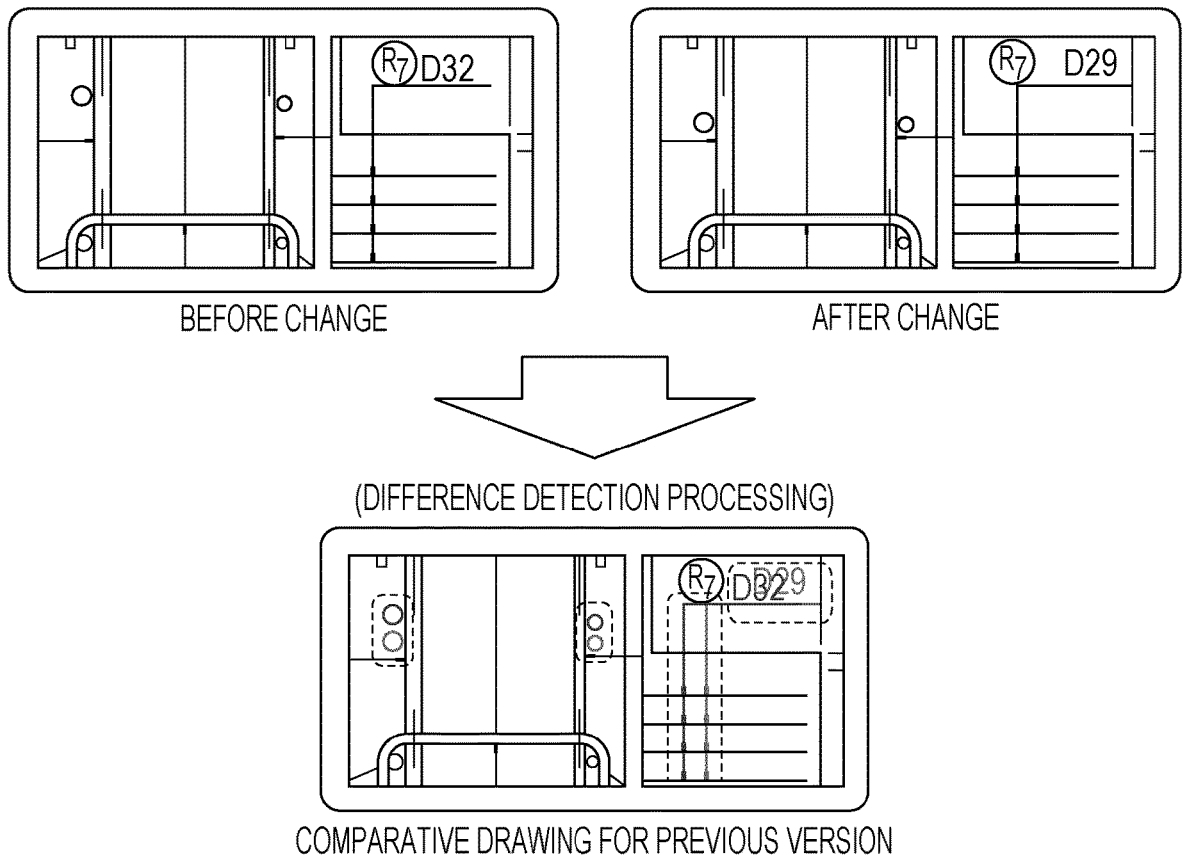
FIG. 9 illustrates a specific example of a comparative drawing for the previous version.

FIG. 9 illustrates a specific example of a comparative drawing for the previous version. The drawing comparator 40 generates a comparative drawing by comparing an image of a drawing to which a design change has been made with that of a drawing to which the design change has not yet been made. As a result of executing known difference detection processing on two drawing images, for example, the drawing comparator 40 detects a difference between the two drawing images and generates a comparative drawing for the previous version. In the generated comparative drawing, the difference between the two drawing images is enhanced by using marks indicating different portions, for example.

For example, concerning a subject drawing of the drawing number "1" of the version number "2", a comparative drawing is generated by comparing this subject drawing with the drawing of the drawing number "1" of the version number "1", which is a drawing immediately before a design change has been made to the subject drawing. Likewise, concerning a subject drawing of the drawing number "5" of the version number "3", a comparative drawing is generated by comparing this subject drawing with the drawing of the drawing number "5" of the version number "2", which is a drawing immediately before a design change has been made to the subject drawing.

From the specific examples shown in FIGS. 3 through 9, specific examples of drawing information including "drawing characteristics", "purpose of change", "point to note", and "comparative drawing for previous version" are obtained. Concerning each drawing, the drawing manager 50 manages a drawing in association with drawing information concerning the characteristics of this drawing, the purpose of a design change made to this drawing, a point to note of the design change, and a comparative drawing concerning this drawing, for example. Plural drawings and drawing information associated with the plural drawings are stored in the drawing storage apparatus 200 and are managed by the drawing management system shown in FIG. 1. The drawing management system also searches for drawings to be presented to a user, such as a designer, from among the plural drawings stored in the drawing storage apparatus 200.

Figure 10:
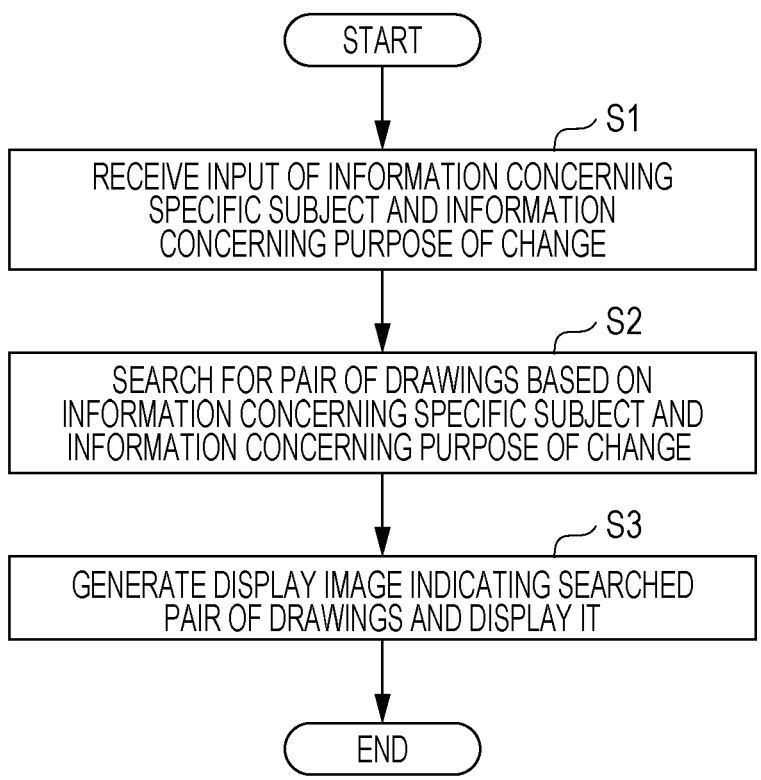
FIG. 10 is a flowchart illustrating a specific example of processing for searching for drawings and presenting them.

FIG. 10 is a flowchart illustrating a specific example of processing for searching for drawings and presenting them. In step S1, the input information receiver 60 receives input of information concerning a specific subject and information concerning the purpose of a design change to be made to this subject. For example, a user, such as a designer, inputs information concerning a specific subject in a designing process and information concerning the purpose of a design change to be made to this subject.

Examples of the specific subject are products and parts to be designed. Information concerning a specific subject includes information for identifying a drawing for this subject (such as the drawing number) and information concerning the characteristics of the drawing for this subject. Examples of the information concerning the characteristics of the drawing are the classification numbers of the characteristics and terms of the characteristics, such as a robot and an arm. Information concerning the purpose of a design change indicates terms described in the field of a design change purpose in a design change material (such as a robot test, a right angle motor, and a motor shaft), for example.

Then, in step S2, on the basis of the information received by the input information receiver 60, the drawing searcher 70 searches for a pair of drawings which have characteristics similar to those of the specific subject and which are constituted by a drawing to which a design change has been made in accordance with the purpose obtained from the input information and a drawing to which the design change has not yet been made. Then, in step S3, the search result display 80 generates a display image indicating the pair of drawings searched by the drawing searcher 70 and displays the generated display image. A specific example of the pair of drawings is a drawing to which a design change has been made and a drawing to which the design change has not yet been made. If multiple pairs of drawings of plural versions are found because design changes have been made multiple times, these multiple pairs of drawings are also considered as a specific example of the pair of drawings.

Figure 11:
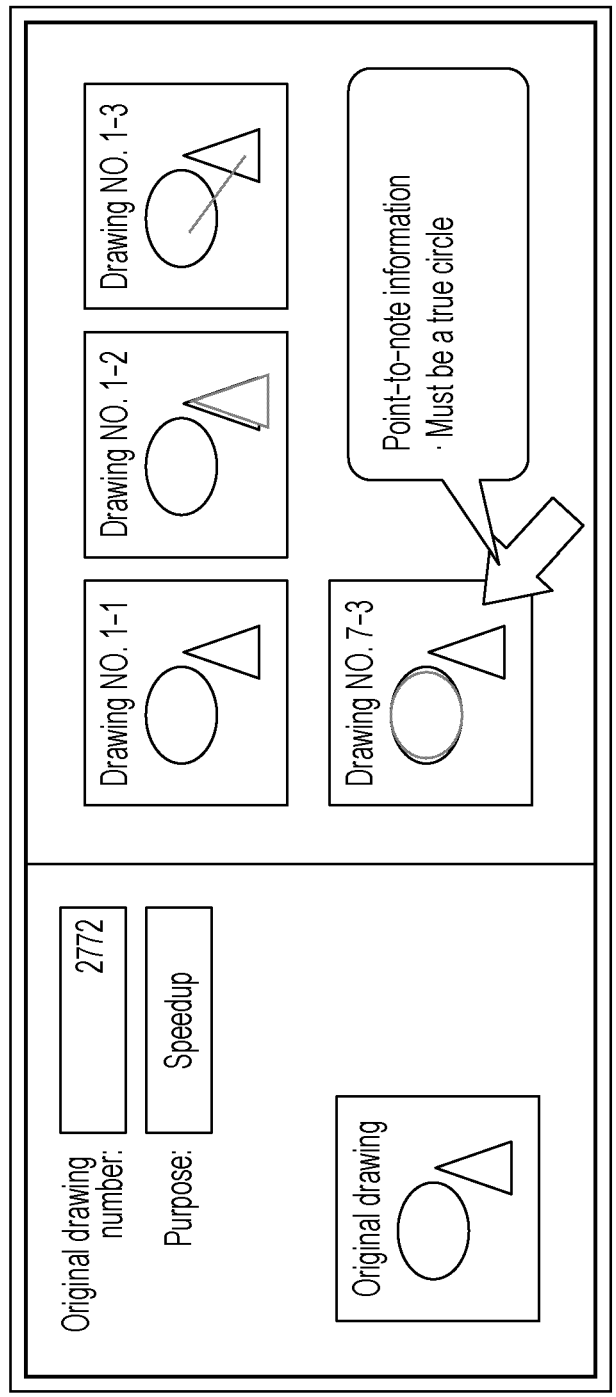
FIG. 11 illustrates a first specific example of a display image indicating search results.

FIG. 11 illustrates a first specific example of the display image indicating the search results. In FIG. 11, the original drawing number "2772" is a drawing number input by a user as information concerning a specific subject, and the purpose "speedup" is a term input by the user as information indicating the purpose of a design change.

In the first specific example in FIG. 11, the drawing searcher 70 searches for drawings based on the original drawing number "2772" and the purpose "speedup". The drawing searcher 70 searches for drawings having characteristics similar to those of the drawing of the original drawing number "2772" (drawings which satisfy similarity conditions) and having the purpose which match the purpose "speedup" input by the user (drawings which satisfy matching conditions).

In the first specific example in FIG. 11, the drawings of drawing numbers 1-1, 1-2, and 1-3 (drawing number 1 of version numbers 1, 2, and 3) and a drawing of drawing number 7-3 (drawing number 7 of version number 3) are searched for by the drawing searcher 70, and the display image shown in FIG. 11 is generated by the search result display 80. FIG. 11 shows a display image of thumbnail images of comparative drawings (FIG. 9) generated from the searched pair of drawings. Instead of a comparative drawing, a pair of a drawing to which a design change has been made and a drawing to which the design change has not yet been made may be displayed side by side.

If a point to note concerning a searched drawing is found, the search result display 80 also displays information indicating the point to note. The search result display 80 displays information indicating the point to note concerning a drawing selected by the user, for example. For example, in the first specific example in FIG. 11, if the drawing of the drawing number 7-3 is selected (focused) as a result of the user operating the moving arrow cursor, information indicating a point to note on designing of the drawing number 7-3 pops up.

Figure 12:
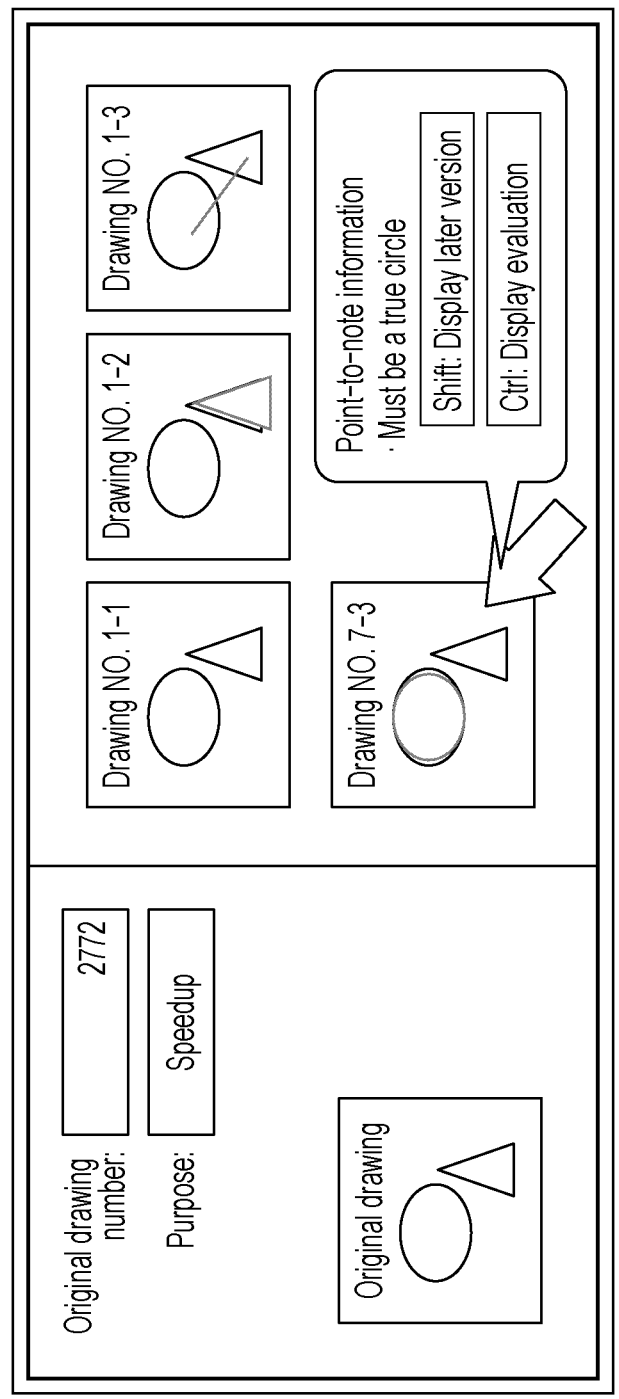
FIG. 12 illustrates a second specific example of a display image indicating search results.

FIG. 12 illustrates a second specific example of the display image indicating the search results. In the second specific example in FIG. 12, as well as in the first specific example in FIG. 11, the drawings of drawing numbers 1-1, 1-2, and 1-3 and the drawing of drawing number 7-3 are searched for by the drawing searcher 70, based on the original drawing number "2772" and the purpose "speedup", and a display image showing the search results is generated by the search result display 80.

If a searched drawing has a later version and if a drawing of the later version is not included in the search results, the search result display 80 presents information indicating that a certain drawing has a later version to the user. In the second specific example in FIG. 12, for example, if the drawing of the drawing number 7-3 is selected (focused) as a result of the user operating the moving arrow cursor, information indicating a point to note concerning the drawing of the drawing number 7-3 pops up, as in the first specific example in FIG. 11. If the drawing of the drawing number 7-3 has a later version, a display icon indicating that the drawing number 7-3 has a later version is added to the popup. For example, if the user presses a shift key "Shift" in the second specific example in FIG. 12, the image of the drawing of the later version (such as drawing number 7-4, which is not included in the search results) of the drawing number 7-3 is displayed.

The search result display 80 may also display error information concerning a searched drawing. If error information (information concerning errors occurred in parts or products included in drawings) is associated with plural drawings managed by the drawing management system shown in FIG. 1, it is stored in the error information storage apparatus 300. Error information may alternatively be stored in the drawing storage apparatus 200 as part of the drawing information (FIG. 2).

If error information is associated with a searched drawing, the search result display 80 presents the error information to a user. In the second specific example in FIG. 12, for example, if the drawing of the drawing number 7-3 is selected (focused) as a result of the user operating the moving arrow cursor and if error information is associated with the drawing of the drawing number 7-3, a display icon indicating that error information is associated with the drawing of the drawing number 7-3 is added to the popup.

The search result display 80 may also display evaluation information concerning a searched drawing. If evaluation information is associated with plural drawings managed by the drawing management system shown in FIG. 1, it is stored in the evaluation-related information storage apparatus 400. Evaluation information may alternatively be stored in the drawing storage apparatus 200 as part of the drawing information (FIG. 2).

If evaluation information is associated with a searched drawing, the search result display 80 presents the evaluation information to a user. In the second specific example in FIG. 12, for example, if the drawing of the drawing number 7-3 is selected (focused) as a result of the user operating the moving arrow cursor and if evaluation information is associated with the drawing of the drawing number 7-3, a display icon indicating that evaluation information is associated with the drawing of the drawing number 7-3 is added to the popup. Then, if the user presses a control key "Ctrl", evaluation information concerning the drawing of the drawing number 7-3 is displayed.

Figure 13:
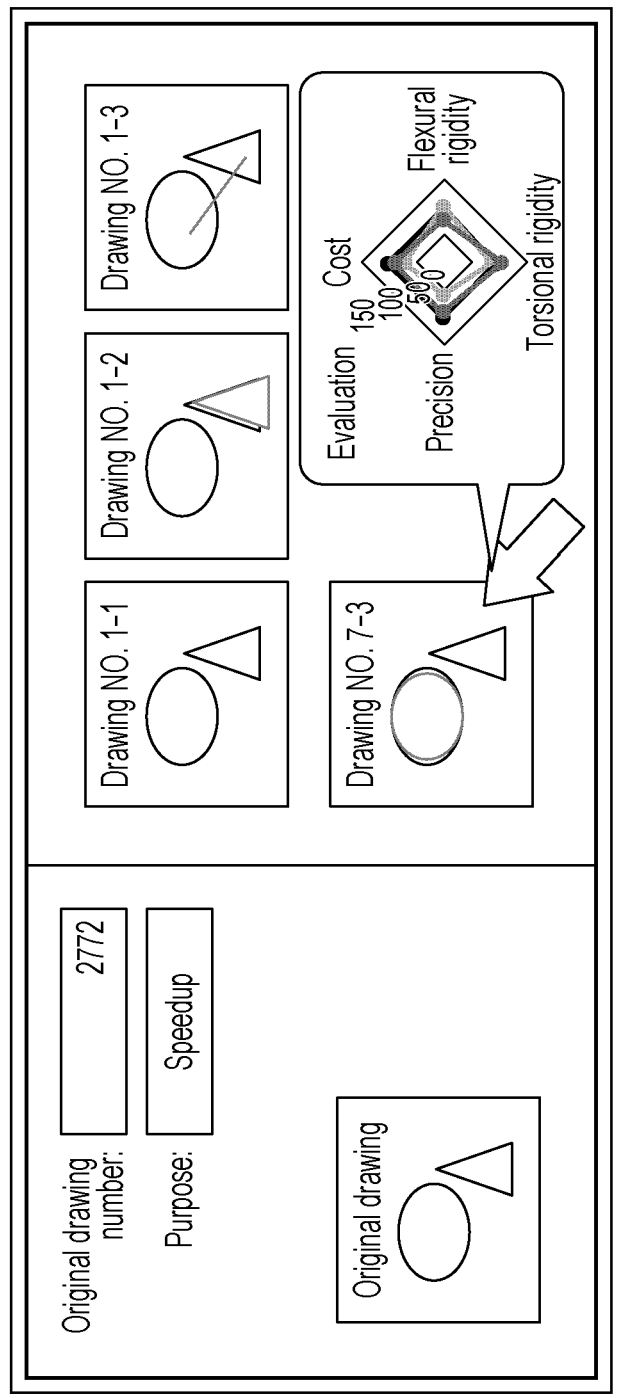
FIG. 13 illustrates a display example of evaluation information.

FIG. 13 illustrates a display example of evaluation information. As in the first and second specific examples in FIGS. 11 and 12, in FIG. 13, the drawings of drawing numbers 1-1, 1-2, and 1-3 and the drawing of drawing number 7-3 are searched for by the drawing searcher 70, based on the original drawing number "2772" and the purpose "speedup" input by the user, and a display image showing the search results is displayed.

When the user presses the control key "Ctrl" in the second specific example in FIG. 12, evaluation information concerning the drawing of the drawing number 7-3 is displayed. In the display example in FIG. 13, the evaluation information is displayed as a radar chart.

Figure 14:
FIG. 14 illustrates a specific example of evaluation-related information.

FIG. 14 illustrates a specific example of evaluation-related information. As the evaluation-related information, evaluation information is displayed, as shown in the upper section of FIG. 14, and evaluation unit information is displayed, as shown in the lower section of FIG. 14.

The evaluation information is information indicating evaluation results concerning a product or a part associated with each drawing. The evaluation results are obtained by simulations. As in the specific example in FIG. 14, for example, information such as an evaluation variable (evaluation element) and a value (evaluation result) is associated with each drawing identified by the drawing number and the version. Evaluation information is stored in the evaluation-related information storage apparatus 400. Evaluation information may alternatively be stored in the drawing storage apparatus 200 as part of the drawing information (FIG. 2).

The evaluation unit information is information indicating the unit and the evaluation standard for each evaluation variable, and is stored in the evaluation-related information storage apparatus 400, for example. When forming a radar chart from the evaluation information concerning a drawing, the search result evaluator 90 determines the scores of the evaluation variables (magnitudes of the evaluation variables in the radar chart) in accordance with the evaluation standard included in the evaluation unit information.

In a radar chart, evaluation information concerning plural versions (plural version numbers) of a drawing may be displayed. For example, in the specific example in FIG. 13, in the radar chart concerning the drawing of the drawing number 7-3 (drawing number 7 of version number 3), evaluation information concerning the drawing of the drawing number 7-1 (drawing number 7 of version number 1) and the drawing of the drawing number 7-2 (drawing number 7 of version number 2) may also be displayed. In this case, items of evaluation information concerning plural versions (plural version numbers) are displayed in different display modes (such as in different colors or line types).

The foregoing description of the exemplary embodiment of the present invention has been provided for the purposes of illustration and description. It is not intended to be exhaustive or to limit the invention to the precise forms disclosed. Obviously, many modifications and variations will be apparent to practitioners skilled in the art. The embodiment was chosen and described in order to best explain the principles of the invention and its practical applications, thereby enabling others skilled in the art to understand the invention for various embodiments and with the various modifications as are suited to the particular use contemplated. It is intended that the scope of the invention be defined by the following claims and their equivalents.

What is claimed is:

1. A drawing management apparatus comprising:
    an input device; and
    a processor configured to:
        receive input of information from the input device concerning a specific subject and information concerning a purpose of a design change to be made to the specific subject;
        search for a pair of drawings which have characteristics similar to characteristics of the specific subject and which are constituted by a drawing to which a design change has been made in accordance with the purpose and a drawing to which the design change has not yet been made, on the basis of the information concerning the specific subject and the information concerning the purpose of the design change; and cause the searched pair of drawings to be displayed to a user, wherein the information concerning the purpose of the design change is recorded by the drawing management apparatus, and the processor is configured to generate a display image indicating the searched pair of drawings and a point to note associated with the searched pair of drawings on the display image.

2. The drawing management apparatus according to claim 1, wherein the processor is configured to generate a display image indicating the searched pair of drawings and comparison information on the display image, the comparison information indicating a result of comparing the searched pair of drawings.

3. The drawing management apparatus according to claim 1, wherein, if the searched pair of drawings has a later version and if a drawing of the later version is not included in the searched pair of drawings, the processor is configured to cause information indicating that the searched pair of drawings has a later version to be presented to the user.

4. The drawing management apparatus according to claim 2, wherein, if the searched pair of drawings has a later version and if a drawing of the later version is not included in the searched pair of drawings, the processor is configured to cause information indicating that the searched pair of drawings has a later version to be presented to the user.

5. The drawing management apparatus according to claim 1, wherein the information from the input device concerning the specific subject indicates the specific subject, and the information concerning the purpose of the design change indicates the purpose of the design change.

6. The drawing management apparatus according to claim 1, wherein the point to note comprises at least one word from design change information for the pair of drawings.

7. A drawing management apparatus comprising:
a processor configured to
extract a characteristic term of a drawing as a characteristic of the drawing;
extract a purpose of a design change made to the drawing from design change information concerning the drawing; and
manage the drawing in association with the extracted characteristic of the drawing and the extracted purpose of a design change made to the drawing,
wherein the purpose of the design change is recorded for the drawing.

8. The drawing management apparatus according to claim 7, wherein the processor is configured to:
extract a point to note on designing of a drawing from the design change information, and
manage a drawing in association with the point to note extracted on designing of the drawing.

9. The drawing management apparatus according to claim 7, wherein the processor is configured to:
generate comparison information by comparing an image of a drawing to which a design change has been made with an image of a drawing to which the design change has not yet been made, and
manage a drawing in association with the comparison information concerning the drawing.

10. The drawing management apparatus according to claim 8, wherein the processor is configured to:

generate comparison information by comparing an image of a drawing to which a design change has been made with an image of a drawing to which the design change has not yet been made, and
manage a drawing in association with the comparison information concerning the drawing.

11. The drawing management apparatus according to claim 7, wherein the processor is configured to:
manage a plurality of drawings as a tree structure representing a parent-child relationship between the plurality of drawings; and
trace the tree structure and extract a characteristic term from a subject drawing and a parent drawing of the subject drawing as a characteristic of the subject drawing.

12. The drawing management apparatus according to claim 8, wherein the processor is configured to:
manage a plurality of drawings as a tree structure representing a parent-child relationship between the plurality of drawings; and
trace the tree structure and extract a characteristic term from a subject drawing and a parent drawing of the subject drawing as a characteristic of the subject drawing.

13. The drawing management apparatus according to claim 9, wherein the processor is configured to:
manage a plurality of drawings as a tree structure representing a parent-child relationship between the plurality of drawings; and
trace the tree structure and extract a characteristic term from a subject drawing and a parent drawing of the subject drawing as a characteristic of the subject drawing.

14. The drawing management apparatus according to claim 10, wherein the processor is configured to:
manage a plurality of drawings as a tree structure representing a parent-child relationship between the plurality of drawings; and
trace the tree structure and extract a characteristic term from a subject drawing and a parent drawing of the subject drawing as a characteristic of the subject drawing.

15. The drawing management apparatus according to claim 7, wherein the processor is configured to extract the characteristic term from the name of the drawing.

16. A drawing management system comprising:
a drawing management apparatus that manages a plurality of drawings; and
a drawing storage apparatus that stores the plurality of drawings,
the drawing management apparatus including
an input device; and
a processor configured to
extract a characteristic term of a drawing as a characteristic of the drawing,
extract a purpose of a design change made to the drawing from design change information concerning the drawing,
associate the drawing with the extracted characteristic of the drawing and the extracted purpose of the design change made to the drawing and store the drawing in the drawing storage apparatus,
receive input of information from the input device concerning a specific subject and information concerning the purpose of the design change to be made to the specific subject, search, from among the plurality of drawings stored in the drawing storage apparatus, for a pair of drawings which have characteristics similar to characteristics of the specific subject and which are constituted by a first drawing to which a design change has been made in accordance with the purpose and a second drawing to which the design change has not yet been made, on the basis of the information concerning the specific subject and the information concerning the purpose of the design change, and cause the searched pair of drawings to be displayed to a user wherein the purpose of the design change is recorded for the first drawing.

17. The drawing management system according to claim 16, wherein the processor is configured to extract the characteristic term from the name of the drawing, the information from the input device concerning the specific subject indicates the specific subject, and the information concerning the purpose of the design change indicates the purpose of the design change.

\* \* \* \* \*